United States Patent
Huang et al.

(10) Patent No.: US 11,570,887 B2
(45) Date of Patent: Jan. 31, 2023

(54) ON-BOARD INTEGRATED ENCLOSURE FOR ELECTROMAGNETIC COMPATIBILITY SHIELDING

(71) Applicant: Marvell Asia Pte, Ltd., Singapore (SG)

(72) Inventors: Shaowu Huang, Sunnyvale, CA (US); Dance Wu, Palo Alto, CA (US)

(73) Assignee: Marvell Asia Pte, Ltd., Singapore (SG)

( * ) Notice: Subject to any disclaimer, the term of this patent is extended or adjusted under 35 U.S.C. 154(b) by 0 days.

(21) Appl. No.: 17/205,727

(22) Filed: Mar. 18, 2021

(65) Prior Publication Data
US 2021/0298168 A1    Sep. 23, 2021

Related U.S. Application Data

(60) Provisional application No. 62/991,490, filed on Mar. 18, 2020.

(51) Int. Cl.
*H05K 1/18* (2006.01)
*H05K 9/00* (2006.01)
*H05K 1/02* (2006.01)

(52) U.S. Cl.
CPC ........... *H05K 1/0231* (2013.01); *H05K 1/181* (2013.01); *H05K 9/0024* (2013.01); *H05K 9/0088* (2013.01); *H05K 2201/10371* (2013.01)

(58) Field of Classification Search
CPC ............................ H05K 1/0218; H05K 9/0022
See application file for complete search history.

(56) References Cited

U.S. PATENT DOCUMENTS

| 4,697,858 A | 10/1987 | Balakrishnan |
| 5,208,561 A | 5/1993 | Xavier et al. |
| 6,541,711 B1 | 4/2003 | Dube et al. |
| 2005/0095410 A1 | 5/2005 | Mazurkiewicz |
| 2013/0196539 A1* | 8/2013 | Shafer ............... H05K 9/006 361/752 |
| 2015/0282298 A1* | 10/2015 | Atkinson ............ H05K 9/0015 174/251 |
| 2016/0302301 A1* | 10/2016 | Kim .................... H05K 3/0044 |
| 2017/0311449 A1 | 10/2017 | Ohsawa et al. |

FOREIGN PATENT DOCUMENTS

| EP | 3806588 | 4/2021 |
| WO | WO 2013/085071 | 6/2013 |

OTHER PUBLICATIONS

Olivieri et al., "A Removable EBG-Based Common Mode Filter for PCIE-Oriented High-Speed Buses" XP55807985, Jan. 1, 2018, Retrieved from the Internet: URL:https://caelynx.com/wp-content/uploads/2019/07/r-ebg-based-filter.pdf.

* cited by examiner

*Primary Examiner* — Hung V Ngo

(57) ABSTRACT

A printed circuit board (PCB) and a method of manufacturing the same is described. The PCB includes a substrate defining a major plane and an integrated electromagnetic interference and compatibility (EMC/EMI) shielding enclosure configured to enclose the substrate. The shielding enclosure includes a metallic top layer deposited on top of the major plane of the substrate so as to envelop an uppermost layer of the substrate, a metallic bottom layer deposited on bottom of the major plane of the substrate so as to envelop a bottommost layer of the substrate, and a metallic side layer formed along a length of one or more edges of the substrate to electrically connect the metallic top layer and the metallic bottom layer.

18 Claims, 8 Drawing Sheets

ON-BOARD INTEGRATED ENCLOSURE FOR ELECTROMAGNETIC COMPATIBILITY SHIELDING

CROSS REFERENCE TO RELATED APPLICATION

This disclosure claims the benefit of, commonly-assigned U.S. Provisional Patent Application No. 62/991,490, filed Mar. 18, 2020, which is hereby incorporated by reference herein in its entirety.

FIELD OF USE

This disclosure relates to electromagnetic compatibility (EMC) shielding. More particularly, this disclosure relates to an on-board enclosure formed on a printed circuit board for EMC/EMI shielding in high-speed automotive networking with shielded cable channels.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted to be prior art against the subject matter of the present disclosure.

Wireline communication links for some high-speed interfaces, particularly for networking applications, operate under various standards that include strict electromagnetic compatibility requirements incorporating cable shielding specifications. However, in many situations, EMC shielding is challenging in high-speed automotive networking with shielded cable channels. More particularly, connections of cable shields to printed circuit board (PCB) grounds through cable connectors can still cause various EMC issues. For example, it is difficult to divert radiofrequency (RF) noise currents from the shielded cables through the connector to the PCB grounds.

SUMMARY

A printed circuit board in accordance with implementations of the subject matter of this disclosure includes a substrate defining a major plane, and an integrated electromagnetic interference and compatibility (EMC/EMI) shielding enclosure configured to enclose the substrate. The shielding enclosure includes a metallic top layer deposited on top of the major plane of the substrate so as to envelop an uppermost layer of the substrate, a metallic bottom layer deposited on bottom of the major plane of the substrate so as to envelop a bottommost layer of the substrate, and a metallic side layer formed along a length of one or more edges of the substrate to electrically connect the metallic top layer and the metallic bottom layer.

In a first implementation of such a printed circuit board, the metallic side layer of the EMC/EMI shielding enclosure is formed of a copper plating electrically connecting the metallic top layer and the metallic bottom layer to form an metallic enclosure disposed in propinquity to, and enveloping, the printed circuit board.

A second implementation of such a printed circuit board, the metallic side layer of the EMC/EMI shielding enclosure is formed by a plurality of stitching vias electrically connecting the metallic top layer and the metallic bottom layer.

In an example of such a second implementation, the metallic side layer of the EMC/EMI shielding enclosure is formed by two or more rows of the plurality of stitching vias.

In a third implementation of such a printed circuit board, the substrate further comprises a first surface and a second surface, a plurality of high-density interconnect vias penetrating the first surface and extending partially through the PCB toward the second surface, the high-density interconnect vias configured to receive to interconnect at least one component to the PCB, and a plurality of electrical connectors disposed in a region of the second surface opposite the high-density interconnect vias and configured to interface with one or more signal processing components disposed on the second surface.

In a first example of such a third implementation, the plurality of high-density interconnect vias comprise one of: blind vias, buried vias, and micro-vias.

In a fourth implementation of such a printed circuit board, the EMC/EMI shielding enclosure further includes a first opening on a first side of one of the metallic top layer or the metallic bottom layer configured for mounting thereon one or more functional circuit elements, and a second opening on a second side of one of the metallic top layer or the metallic bottom layer configured for mounting thereon of a connector, opposite the first side, for coupling to a shielded communications cable.

In a fifth implementation of such a printed circuit board, the EMC/EMI shielding enclosure further includes a third opening between the first opening and the second opening, configured for mounting thereon of a surface mounted capacitor configured to couple a digital grounding layer and a cable grounding layer.

In a sixth implementation of such a printed circuit board, the substrate further includes an embedded capacitor, formed on an internal layer of the PCB, configured to couple a digital ground layer and a cable grounding layer, where the metallic top layer is deposited above the embedded capacitor.

In a seventh implementation of such a printed circuit board, the metallic top layer and the metallic bottom layer form a continuous enclosure over the uppermost layer of the substrate and the bottommost layer of the substrate respectively.

A method according to implementations of the subject matter of this disclosure for manufacturing a printed circuit board comprising shielded electromagnetic compatibility/electromagnetic interference (EMC/EMI) shielding enclosure includes depositing a metallic top layer on top of a substrate so as to envelop an uppermost layer of the substrate, depositing a metallic bottom layer on bottom of the substrate so as to envelop a bottommost layer of the substrate, and depositing a metallic side layer along a length of one or more edges of the substrate to connect the metallic top layer and the metallic bottom layer.

A first implementation of such a method further includes electroplating copper material on an edge of the substrate electrically connecting the metallic top layer and the metallic bottom layer.

A second implementation of such a method further includes stitching a plurality of vias along an edge of the substrate electrically connecting the metallic top layer and the metallic bottom layer.

In an example of such a second implementation, the metallic side layer of the EMC/EMI shielding enclosure is formed by two or more rows of the plurality of stitching vias.

A third implementation of such a method further includes forming a plurality of penetrating holes through a first surface and a second surface of the substrate, and inserting a plurality of high-density interconnect vias penetrating the first surface and extending partially through the PCB toward the second surface, wherein the high-density interconnect vias are configured to interconnect at least one component to the PCB.

In a first example of such a third implementation, the plurality of high-density interconnect vias comprise one of: blind vias, buried vias, and micro-vias.

A fourth implementation of such a method also includes forming a first opening on a first side of one of the metallic top layer or the metallic bottom layer configured for mounting thereon of functional circuit elements, and forming a second opening on a second side of one of the metallic top layer or the metallic bottom layer configured for mounting thereon of a connector, opposite the first side, for coupling to a shielded communications cable.

A fifth implementation of such a method also includes forming a third opening between the first opening and the second opening, and mounting a surface-mounted capacitor configured to couple a digital ground and a cable ground at the third opening.

A sixth implementation of such a method further includes forming an embedded capacitor on an internal layer of the PCB, wherein the embedded capacitor is configured to couple a digital ground layer and a cable grounding layer, and depositing the metallic top layer above the embedded capacitor.

A seventh implementation of such a method also includes depositing the metallic top layer and the metallic bottom layer to form a continuous enclosure over the uppermost layer of the substrate and the bottommost layer of the substrate respectively.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which.

DETAILED DESCRIPTION

Figure 1:
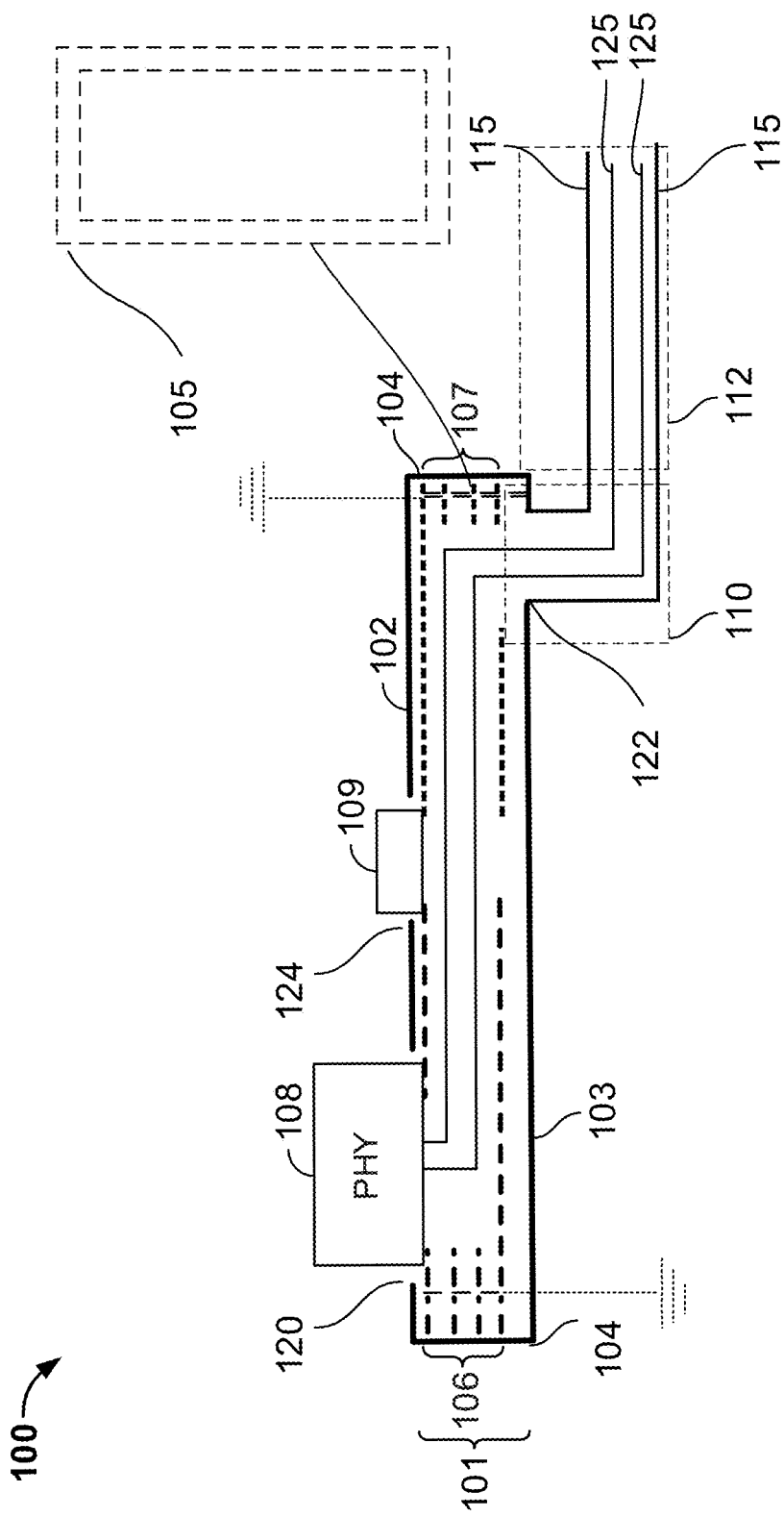
FIG. 1 shows a cross-sectional view of a portion of a wireline communication system incorporating implementations of the subject matter of this disclosure.

As noted above, wireline connections for some high-speed interfaces, particularly, e.g., for networking applications, operate under various standards that include strict electromagnetic compatibility (EMC) requirements incorporating cable shielding specifications. Those applications may include automotive Ethernet under the IEEE 802.3ch and 802.3cy standards, as well as the A-PHY long-reach SerDes standard of the MIPI Alliance, Inc., and standards set by the NAV Alliance and the Automotive SerDes Alliance (ASA). However, the subject matter of this disclosure also may be relevant to any other kind of high-speed signaling over frequencies in the RF range.

Although multi-gigabit automotive networking standards mentioned above (e.g. Ethernet 802.3ch, 802.3cy, ASA, MIPI APHY, NAV) have adopted shielded cables (Coax/Shielded Twisted Pair/Shielded Parallel Pair) for improved EMC shielding performance, the connections of cable shields to Printed Circuit Board (PCB) grounds through cable connectors still cause various EMC issues.

In a typical scenario, functional circuitry may be mounted on a PCB along with a cable connector. For example, in a networking scenario, the functional circuitry may include an Ethernet physical layer transceiver (PHY), as well as other components, while the cable connector is a grounded coaxial connector or a grounded connector for a shielded twisted pair (STP) or shielded parallel pair (SPP) cable.

As discussed above, connections of cable shields to the PCB through cable connectors cause various EMC issues. For example, it is difficult to divert radiofrequency (RF) noise currents from the shielded cables through the connector to the PCB grounds. One conventional solution to minimize such interference is to provide a shielding enclosure (e.g., a Faraday cage) to block electromagnetic fields. However, for such shielded enclosures to be effective, the connections for the shielded (or unshielded) cables at the connectors need to be surrounded entirely (360 degrees), which is difficult to realize in practice. Moreover, conventionally used shielding enclosures are large in size and difficult to implement, particularly in an automotive environment where space is at a premium. Accordingly, there is a need for shielding enclosures that are compact in size and provide 360-degree enclosure around the PCB and the various functional circuitry mounted thereon.

Accordingly, in accordance with implementations of the subject matter of this disclosure, a printed circuit board includes a substrate defining a major plane and an integrated electromagnetic interference and compatibility (EMC/EMI) shielding enclosure deposited on the substrate and configured to enclose the substrate. The EMC/EMI shielding enclosure includes a metallic top layer deposited on top of the major plane of the substrate and a metallic bottom layer deposited on bottom of the major plane of the substrate. A metallic side layer extending along an edge of the substrate of the printed circuit board is configured to connect the metallic top layer and the metallic bottom layer. In between the top and bottom metallic layers dedicated for shielding, there can be an arbitrary (mostly even) number of substrate layers in the printed circuit board. The printed circuit board can include any number of side edges (for example, a rectangular shaped printed circuit board will have four edges while a polygonal shaped printed circuit board can have more than four edges). The metallic side layer is deposited on all of the edge surfaces of the printed circuit board so as to enclose the substrate in its entirety on all sides.

In typical implementations, a PCB is formed of a dielectric substrate layer having metallic surface layer in which a pattern of conductive traces is formed to interconnect the PHY with other components as well as with conductors in the cable connector. More complex PCBs may have multiple patterned metallic layers, separated by additional dielectric layers, providing more complex signal routing by allowing traces to cross without intersecting (e.g., using through-hole vias to allow signals to jump from one layer to another). In an implementation, metallic top and bottom layers of the shielded enclosure are formed, for example by metallic deposition or other suitable plating technique, directly on top of the substrate layer during the manufacturing process of the PCB, thereby providing for a PCB having an integrated EMC/EMI shielding, the shielding being more compact in size compared to conventional discrete shielding enclosures. Moreover, such integrated shielding offers the possibility of a full 360-degree enclosure surrounding the entire PCB.

In one implementation, the metallic side layer of the EMC/EMI shielding enclosure is formed of a copper plating so as to connect the metallic top layer to the metallic bottom layer thereby forming the integrated enclosure surrounding the entire substrate. More specifically, in an implementation, the metallic side layer is formed using a PCB edge plating process where the metallic top layer and the metallic bottom layer are connected by electroplating a copper layer around the edges of the PCB.

In another implementation in accordance with the subject matter of this disclosure, the metallic side layer of the EMC/EMI shielding enclosure connecting the metallic top and bottom layers is formed by a plurality of stitching vias. The extra via fence forms the peripheral portion of overall shielding structure and serves to isolate EMI from the printed circuit board. In one example of this implementation, multiple rows of ground stitching vias are used to form the metallic side layer of the EMC/EMI shielding enclosure.

In one implementation in accordance with the subject matter of this disclosure, the substrate of the PCB includes a plurality of parallel surfaces. A plurality of high-density interconnect vias penetrate each of the plurality of surfaces to connect the different surfaces of the substrate. In an embodiment, the high-density interconnect vias are used as interconnection for one or more components to be connected to the PCB. The plurality of high-density interconnect can be one or more of blind vias, buried vias, and micro-vias.

In one implementation, the EMC/EMI shielding enclosure also includes a first opening on a first side of one of the metallic top layer or the metallic bottom layer configured for mounting thereon of functional circuit elements. For example, a PHY device is connected to the PCB at the first opening of the EMC/EMI shielding enclosure. The EMC/EMI shielding enclosure can also include a second opening on a second side of one of the metallic top layer or the metallic bottom layer configured for mounting thereon of a connector, opposite the first side, for coupling to a shielded communications cable. Although these openings in the EMC/EMI shielding enclosure can become a source of EMI leakage, the size of these openings can be tailored to match the corresponding connections during deposition of the metallic layers directly onto the uppermost and bottommost layers of the PCB substrate, in order to minimize and EMI leakage. In an implementation, the EMC/EMI shielding enclosure for the PHY device can be a chip package metal case or in the form of package EMI molding. These EMI metal case or molding of package are tightly and properly connected and grounded with the top and/or bottom layer grounds of the PCB.

The PCB in accordance with one implementation of the subject matter of this disclosure has two separate grounds, a digital ground and a cable ground. The two separate grounds can be connected with one or multiple capacitors for an AC-grounding connection. In one implementation, one or multiple embedded capacitors configured to couple the digital grounding layer and the cable grounding layer are also included, where the metallic top layer is deposited on top of the embedded capacitor. In another implementation, the metallic top layer or the metallic bottom layer can include a third opening for mounting of a surface-mounted capacitor coupling the cable grounding layer and the digital grounding layer. Additional details about suitable ways to provide two different groundings—a digital grounding layer and a cable grounding layer—can be found in U.S. application Ser. No. 17/249,560, the entirety of which is hereby incorporated by reference.

A PCB as described above in accordance with the subject matter of this disclosure may be used as part of a wireline communications system. Examples of a wireline communications system include, but are not limited to, Ethernet systems, and particularly automotive Ethernet systems.

The subject matter of this disclosure may be better understood by reference to FIGS. 1-8.

FIG. 1 shows a cross-sectional view of a portion of a wireline communication system incorporating implementations of the subject matter of this disclosure. In particular, a PCB 100 includes a printed circuit board substrate 101 on which a metallic top layer 102 and a metallic bottom layer 103 are formed by depositing a metallic layer on the uppermost layer of the substrate 101 and the bottommost layer of the substrate 101. For example, in one implementation, the metallic top layer 102 and the metallic bottom layer 103 are formed by directly depositing a copper plating on the uppermost layer and the bottommost layer of the substrate 101 respectively. A metallic side layer 104 connecting the metallic top layer 102 and the metallic bottom layer 103 is formed by electroplating a copper metal layer on all of the edges of the substrate 101. A functional circuit component 108, drawn as a physical layer transceiver (PHY), is mounted in an opening 120 of the metallic top layer 102 on the surface shown as the uppermost layer in the orientation of the drawing, in conductive relationship with a digital ground plane 106. Optionally, the PHY device can be shielded with an additional chip package metal case or package EMI molding, which need to be tightly and properly connected and grounded with the top and bottom layer grounds. As shown in FIG. 1, the bottom metallic layer 103 includes a second opening 122 where a connector 110 is coupled to cable grounding planes 107, and provides a connection for cable 112, which includes a plurality (two shown) of signal conductors 125, surrounded by conductive shielding 115. The cable grounding planes 107 and the digital ground plane 106 are coupled to each other via a surface-mounted capacitor 109, which is mounted at another suitably dimensioned opening 124 in the top metallic layer 102 to minimize loss of effectiveness of the integral shielding enclosure. The separate cable ground and digital ground are connected using an AC-grounding connection by capacitors, in order to avoid ground-loop issues such as automotive multi-gig Ethernet system with single twisted pair (STP) or single parallel pair (SPP) cables. In some other applications, the cable grounding planes 107 and the digital ground plane 106 can be combined as a single ground without capacitor connection between different grounds, in accordance with a DC-grounding scheme.

Signal conductors 125 (see also FIG. 2B), which may be multiple single-ended conductors or the members of a differential conductive pair, are coupled to functional circuit component 108 (e.g., a PHY), which is mounted in a grounding conductive relationship on one of digital grounding planes 106. While digital grounding planes 106 and cable grounding planes 107 are physically separated, and electrically separated in the DC domain, digital grounding planes 106 and cable grounding planes 107 may be coupled in the AC/RF domain by coupling capacitor 109, which is shown in conductive relationship with both (a) one of digital grounding planes 106 and (b) one of cable grounding planes 107.

As shown in FIG. 1, the EMC/EMI shielding enclosure including the metallic top layer 102, the metallic bottom layer 103, and the metallic side layer 104, are formed, for example by metallic deposition or other suitable plating technique, directly on the substrate layer during the manufacturing process of the PCB, thereby providing for a more compact size compared to conventional discrete shielding disclosures and offering the possibility of a full 360-degree enclosure surrounding the entire PCB. The dimension of such an integrated shielding enclosure in accordance with the subject matter of this disclosure can be same or only several millimeters thicker and/or larger than a regular PCB without the disclosed shielding enclosure. In comparison, a conventional metallic PCB enclosure can be 10 to 100 times thicker than the PCB in the vertical dimension and can be larger than PCB by 2 cm to 20 cm in the horizontal dimension.

More particularly, the metallic top layer 102 and the metallic bottom layer 103 are deposited directly on the top substrate layer and the bottom substrate layer of PCB 100. The metallic top layer 102 and the metallic bottom layer 103 are connected to each other by electroplating a copper layer on the edges of the PCB 100 using any suitable PCB edge plating process, in accordance with one implementation of the disclosed subject matter. In still another implementation, the metallic side layer 104 around the edges of the substrate is formed by stitching together a plurality of high-density interconnect (HDI) vias. Specifically, as shown in FIG. 1, the stitching via fence 105 along the edge of the substrate 101 forms the metallic side layer 104 and can replace the PCB edge plating to create the peripheral portion of the integrated EMC/EMI shielding enclosure. Although the implementation shown in FIG. 1 includes two parallel rows of vias stitched together to form the stitching via fence 105, any number of rows may be used to form the fence depending on cost concerns and desired EMC/EMI performance.

Figure 2B:
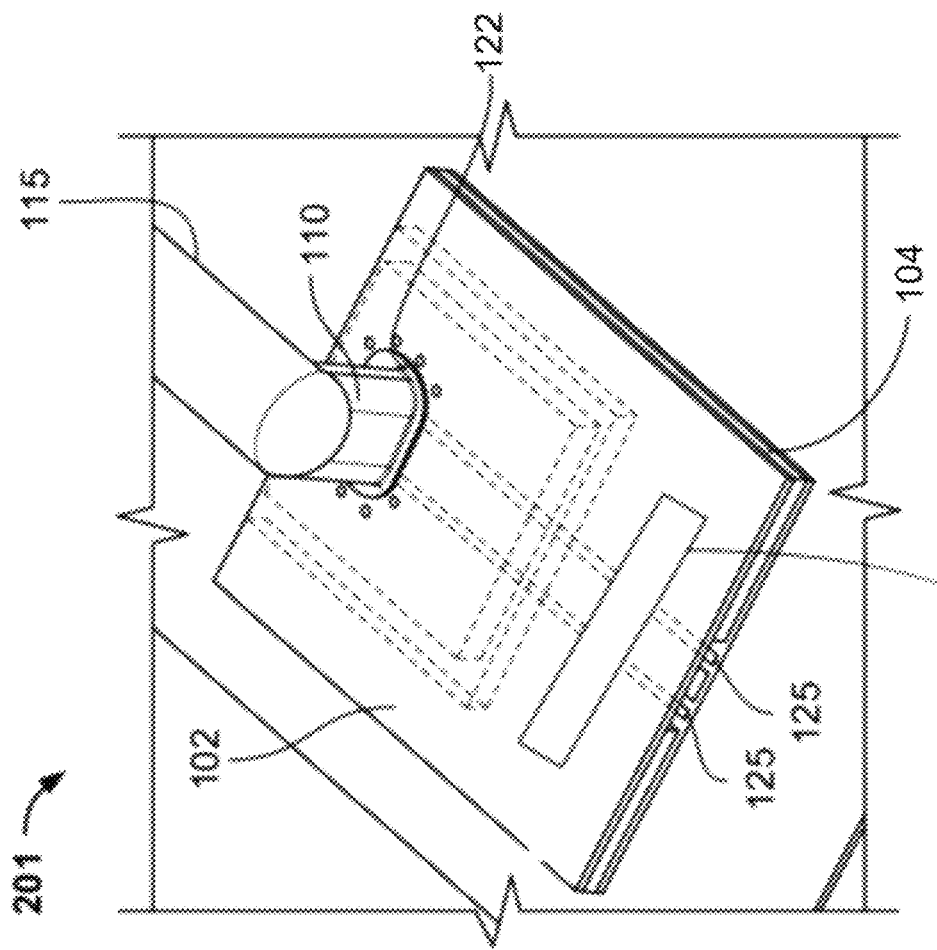
FIG. 2B shows a close up view of a portion of FIG. 2A.
Figure 2A:
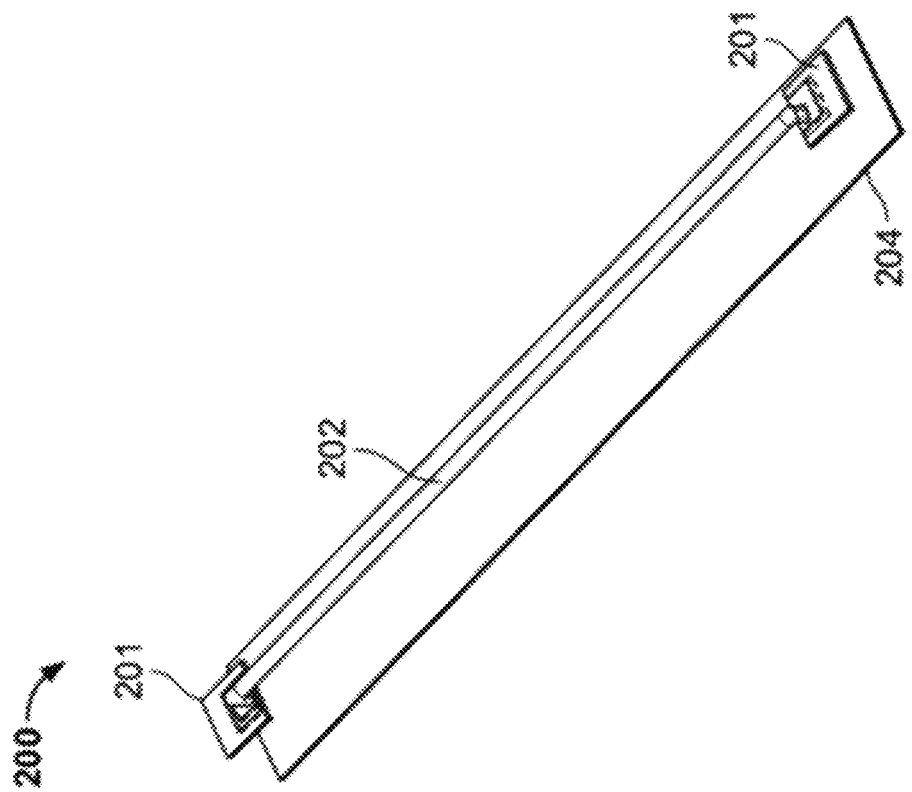
FIG. 2A shows a portion of a wireline communication system incorporating implementations of the subject matter of this disclosure.

FIG. 2A shows a portion 200 of a wireline communication system including a pair of printed circuit boards (PCBs) 201 interconnected by a shielded cable 202. In accordance with implementations of the subject matter of this disclosure, each printed circuit board 201 includes a shielded connector 110 that couples the shielding 112 of cable 202 to one or more grounded layers of PCB 201.

The uppermost layer (as drawn in FIG. 2A) of each PCB 201 is the aforementioned metallic EMC/EMI shielding enclosure deposited upon the substrate of the PCB 201 which, as best seen in FIGS. 1 and 2B, is coextensive with the substrate of the PCB 201 and is uninterrupted over the expanse of PCB 201, except where shielded cable connector 110 is attached. The bottom metallic layer 103 (as shown in FIG. 1) is disposed beneath the substrate of the PCB 201. As seen in FIG. 2A, a shielded cable 202 connects a plurality of PCB substrates 201.

FIG. 2B shows a three dimensional close up view of the PCB 201 of FIG. 2A. As seen in FIG. 2B, the metallic top layer 102 of the EMC/EMI shielding enclosure is formed by metal deposition on the uppermost layer of the substrate of the PCB 201. The metallic top layer 102 includes a suitably dimensioned first opening 120 where one or more PHY devices can be connected to the PCB 201, and the second opening 122 where the shielded cable connector 110 is connected to the PCB 201. Although these openings 120, 122 may affect the EMC/EMI performance of the shielding enclosure, the metal deposition on the remaining surfaces of the substrate of the PCB 201 provides significant EMC/EMI performance improvement while also providing the flexibility to use these shielded PCB 201 in various applications. Moreover, in an embodiment the openings are suitably dimensioned to minimize the loss of shielding effects due to incomplete coverage of a metal layer. Although not shown as a continuous layer for ease of understanding in FIG. 2B, the metallic side layer 104 extends along the entire edge of the PCB 201 and connects the metallic top layer 102 and the metallic bottom layer 103.

Various sample configurations of the metallic EMC/EMI shielded enclosure according to implementations of the subject matter of this disclosure are illustrated schematically in cross-section in FIGS. 3-7, in which the thicknesses of the metallic layers, and the dielectric layers between them (which are implied by empty space but, to maintain drawing clarity, are not explicitly shown) are not drawn to scale. In these drawings, the metallic EMC/EMI shielding enclosures (as well as cable shielding) are shown by thick solid lines, conventional cable ground planes are shown by fine dashed lines, and signal ground planes are shown by coarse dashed lines. Where multiple parallel ground planes are coupled together, that coupling is illustrated by a line perpendicular to those planes. The perpendicular line is dashed, or not dashed, in the same way as the planes that it connects.

Figure 3:
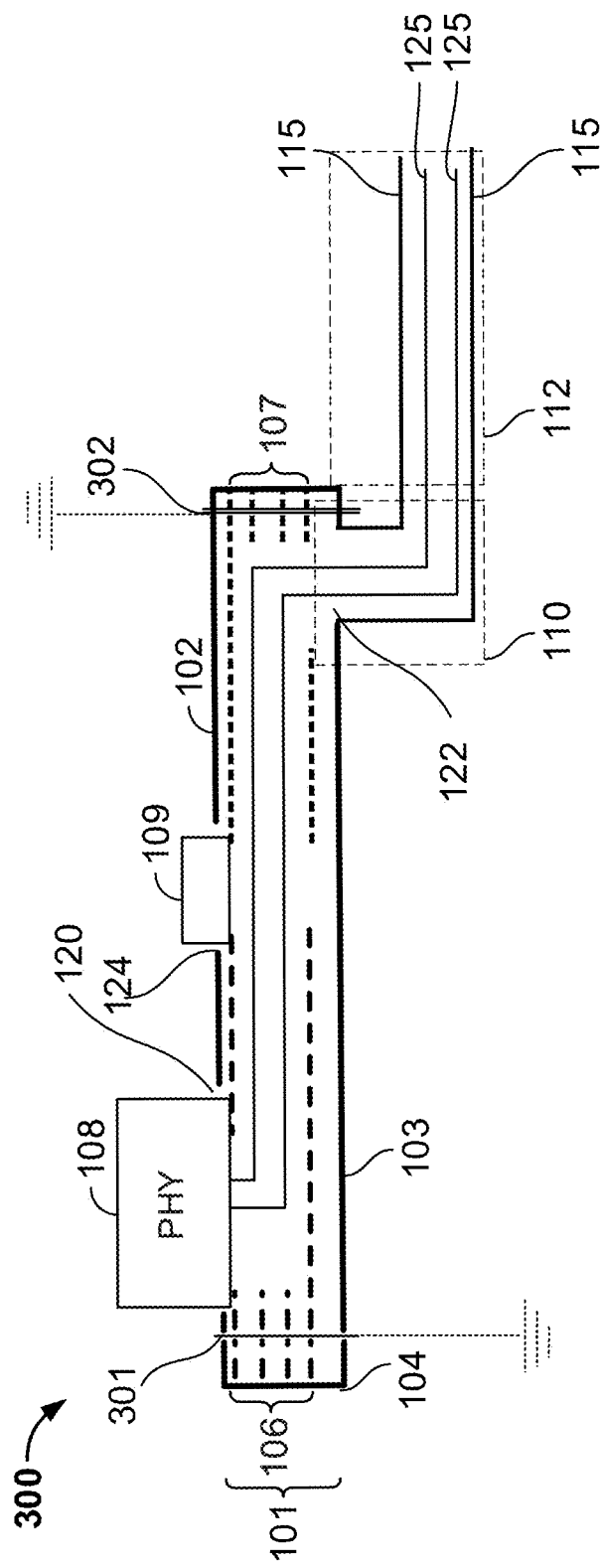
FIG. 3 is a cross-sectional view of an implementation of the subject matter of this disclosure.

Configuration 300 shown in FIG. 3 is substantially identical to the configuration 100, except that PCB 300 includes a plurality of low-cost plated through-hole (PTH) vias 301, 302 (instead of the HDI vias as discussed above in connection with FIG. 1) for signal ground and/or signal/power vertical interconnection. Specifically, PTH vias can be used to replace the HDI vias to form the peripheral portion to reduce the manufacturing cost. Using HDI vias to interconnect the various layers of the substrate of the PCB 101 can be expensive and significantly increase the cost of manufacturing the PCB. HDI vias are more expensive than PTH vias due to the need of more complex manufacturing process, longer manufacturing cycle/time, and more expensive manufacturing equipment. By forming the interconnects using low-cost plated through vias while still forming the EMC/EMI shielded enclosure, significant cost savings can be realized without sacrificing EMC/EMI performance of the PCB 300. The adjacent pitch of the vias fence needs to be small enough, for instance, less than ½₀ of the highest interfering frequency in order to achieve good EMI shielding performance.

Figure 4:
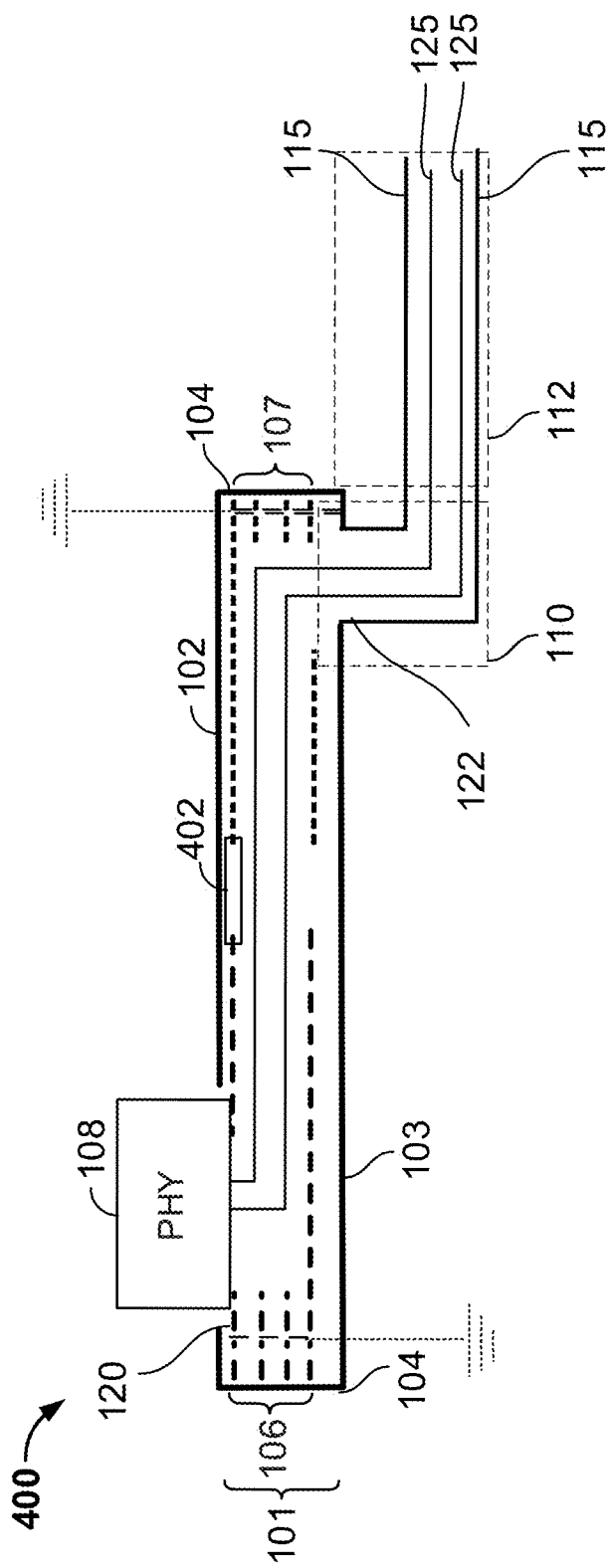
FIG. 4 is a cross-sectional view of a first implementation of the subject matter of this disclosure.

Configuration 400 shown in FIG. 4 is substantially identical to configuration 100, except that PCB 400 in the configuration shown the surface mounted capacitor 109 is replaced by an embedded capacitor 402 underneath the metallic top layer 102. In one implementation, the embedded capacitor is formed as a printed component in a trace layer of the printed circuit board. As noted above, the capacitor 109/402 serves to form an AC-coupled ground connection between the digital ground 106 and the cable ground 107, which in turn improves the EMC/EMI performance of the PCB 400. Moreover, replacing the surface-mounted capacitor 109 with the embedded capacitor 402 and forming the metallic top layer 102 on top of the embedded capacitor 402 further improves the EMC/EMI shielding performance as the gaps (for mounting the surface mounted capacitor 109) in the metallic top layer 102 are eliminated. Although not shown in the drawings, various implementations of the subject matter of this disclosure may include a plurality of symmetrically positioned embedded capacitors 402 coupling the digital ground 106 to the cable ground 107.

Figure 5:
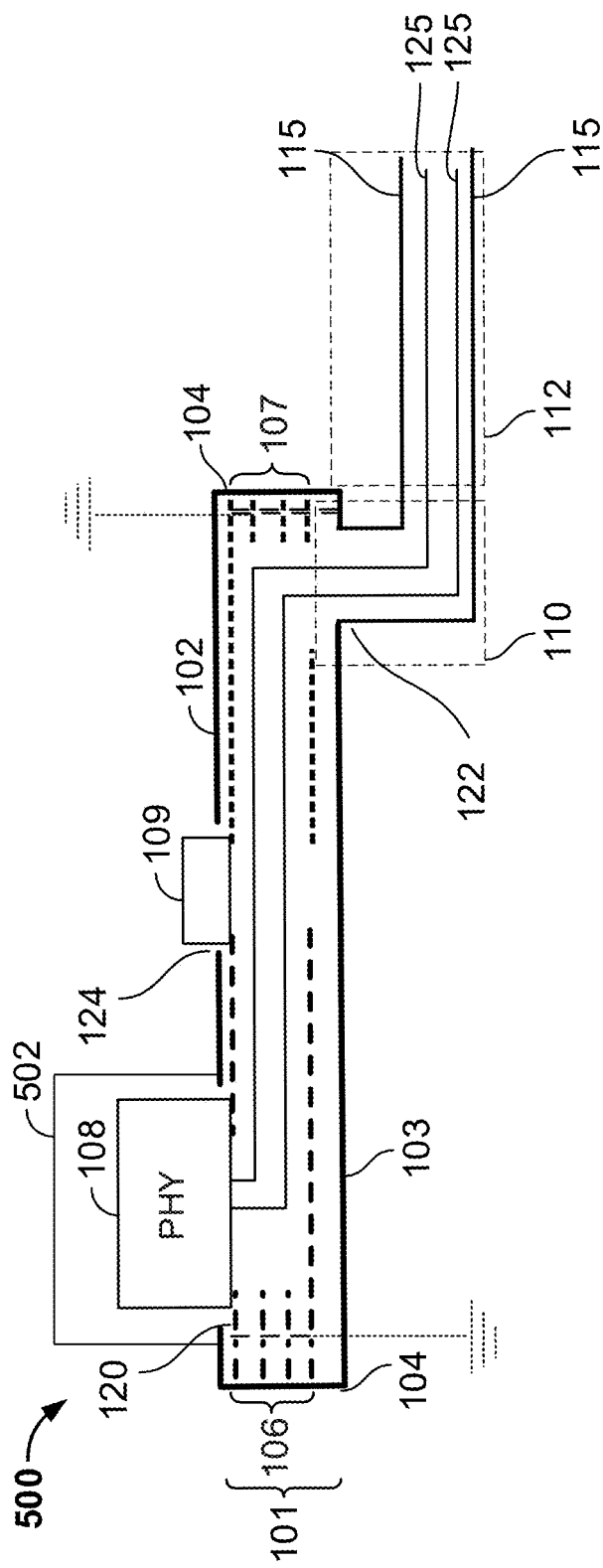
FIG. 5 is a cross-sectional view of a second implementation of the subject matter of this disclosure.

Configuration 500 shown in FIG. 5 is substantially identical to configuration 100, except that PCB 500 includes an additional metal enclosure 502 covering the PHY device 108. In some practical implementations, such a configuration may be required to protect sensitive devices containing analog circuitry and/or operation in a harsh EMI environment such as automotive systems. Adding an additional metal casing 502 to shield the PHY device 108 further improves the EMC/EMI performance of the PCB 500 in some implementations.

Figure 6:
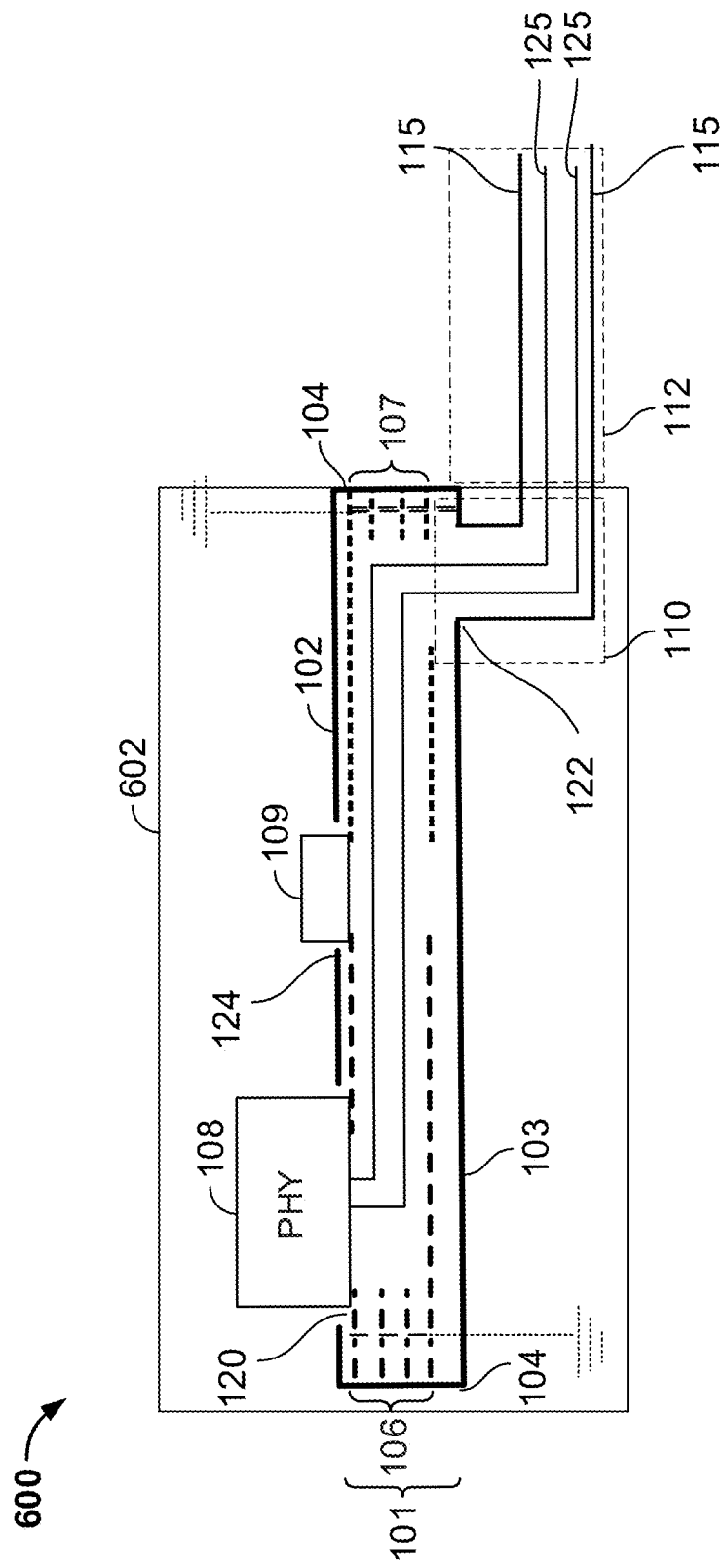
FIG. 6 is a cross-sectional view of a third implementation of the subject matter of this disclosure.

Configuration 600 shown in FIG. 6 is substantially identical to configuration 100, except that PCB 600 further includes a conventional external conductive shielding enclosure 602 in addition to the EMC/EMI shielding enclosure of FIG. 1. The conventional conductive enclosure 602, as is conventionally used, serves as a Faraday cage to provide further improved EMC/EMI performance. However, due to its large size and the openings within the conventional conductive enclosure 602 at the location corresponding to the connector 110, conductive enclosures 602 fail to provide, by themselves, adequate EMC/EMI shielding. However, as shown in the embodiment of FIG. 6, a conductive enclosure 602 is combined with the integrated EMC/EMI shielding enclosure of FIG. 1, to further improve the EMC/EMI performance of the PCB 600, as may be required for some particularly EMC/EMI sensitive implementations.

Figure 7:
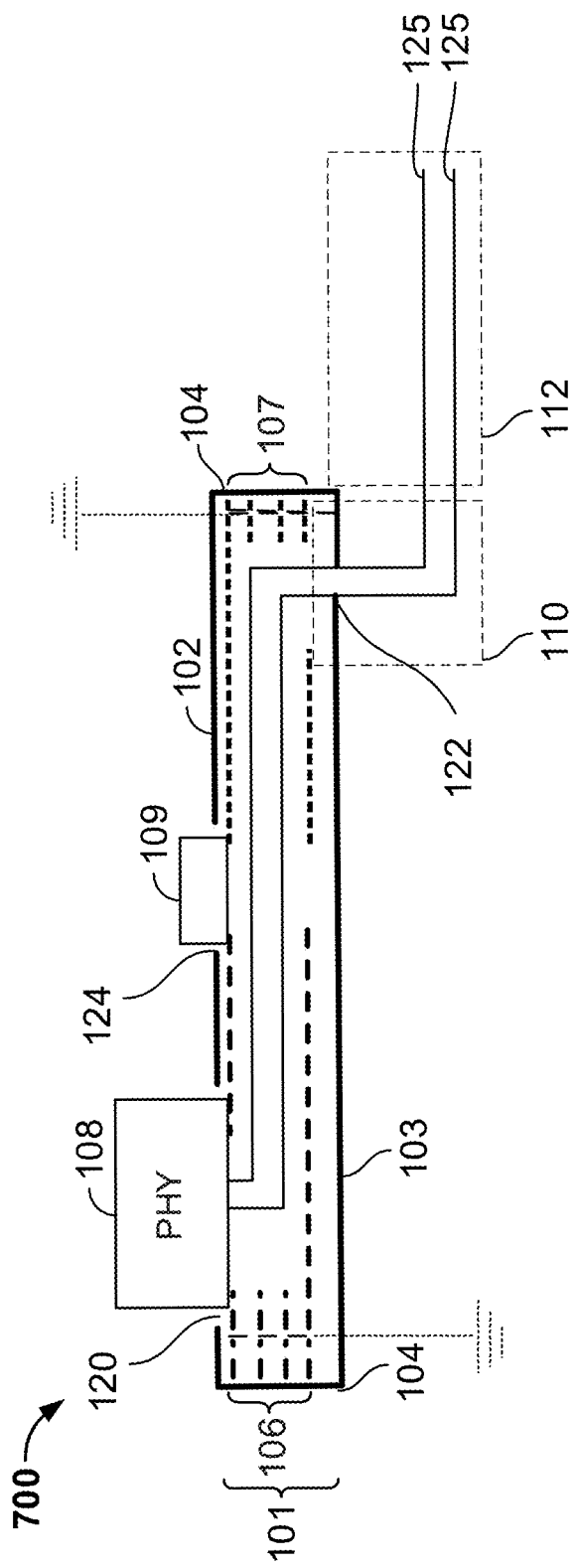
FIG. 7 is a cross-sectional view of a fourth implementation of the subject matter of this disclosure.

Configuration 700 shown in FIG. 7 is substantially identical to configuration 100, except that the signal conductors 125 are not surrounded by conductive shielding 115. Under conventional systems which only provide a conductive enclosure, unshielded cables can be a huge source of degradation in EMC/EMI performance. However, as shown in FIG. 7, the metallic bottom layer 103 includes an opening 122 only fit for the unshielded signal conductors 125 thereby limiting the degradation in EMC/EMI performance. In such a configuration, the interference from the PCB can be still suppressed, while the interference from the cable portion will be less effective than an entirely enclosed substrate. However, during deposition of the copper layer on the bottommost layer of the substrate to form the metallic bottom layer 103, a mold may be used to ensure that the cable connector 110 is tightly fit thereby providing significant EMC/EMI performance improvement when compared to the conventions enclosures. Although not shown in the drawings, in one implementation of the subject matter of this disclosure, the EMC/EMI shielded enclosure of FIG. 1 can be formed to improve the EMC/EMI performance even in a scenario where the PCB is not connected to any external signal conductors, and instead only has two PHY devices 108 mounted thereon.

Figure 8:
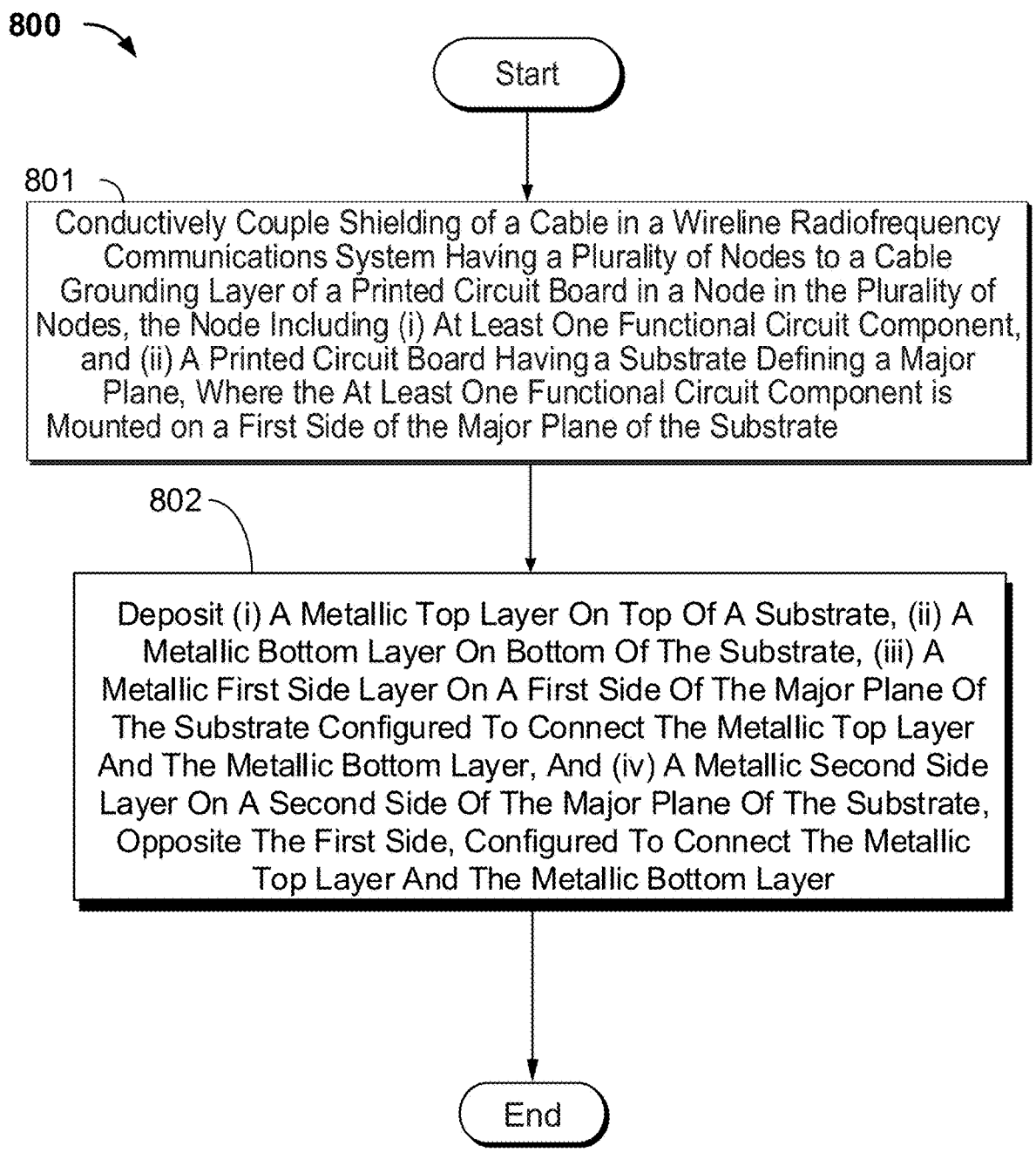
FIG. 8 is a flow diagram illustrating a method according to implementations of the subject matter of this disclosure.

A method according to implementations of the subject matter of this disclosure is diagrammed in FIG. 8.

Method 800 begins at 801 where shielding of a cable, in a wireline communications system having a plurality of nodes, is conductively coupled to a cable grounding layer of a printed circuit board in a node in the plurality of nodes, the node including (i) at least one functional circuit component, and (ii) a printed circuit board having a substrate defining a major plane, where the at least one functional circuit component is mounted on a first side of the major plane of the substrate.

At 802, an EMC/EMI shielding enclosure is formed by depositing (i) a metallic top layer on top of an uppermost layer of a substrate, (ii) a metallic bottom layer on bottom of the bottommost layer of the substrate, and (iii) a metallic side layer extending along the edges of the substrate, and being configured to connect the metallic top layer and the metallic bottom layer. The integrated EMC/EMI shielding enclosure formed in accordance with method 800 described above improves the EMC/EMI performance of the printed circuit board, while maintaining a small form factor as required for various practical implementations. More particularly, by enclosing the substrate of the PCB with the metallic layers being deposited directly onto the surfaces of the PCB substrate, the size of the PCB is only increased by a 1-5 mm, while providing significant EMC/EMI performance improvements.

Thus structures have been described for mitigating EMC/EMI degradation by improved shielding of a printed circuit board.

As used herein and in the claims which follow, the construction "one of A and B" shall mean "A or B."

It is noted that the foregoing is only illustrative of the principles of the invention, and that the invention can be practiced by other than the described embodiments, which are presented for purposes of illustration and not of limitation, and the present invention is limited only by the claims which follow.

What is claimed is:

1. A printed circuit board comprising:
a substrate defining a major plane; and
an integrated electromagnetic interference and compatibility (EMC/EMI) shielding enclosure configured to enclose the substrate, the shielding enclosure including:
a metallic top layer deposited on top of the major plane of the substrate so as to envelope an uppermost layer of the substrate;
a metallic bottom layer deposited on bottom of the major plane of the substrate so as to envelop a bottommost layer of the substrate;
a metallic side layer formed along a length of one or more edges of the substrate to electrically connect the metallic top layer and the metallic bottom layer;
a first opening on a first side of one of the metallic top layer or the metallic bottom layer configured for mounting thereon one or more functional circuit elements; and
a second opening on a second side of one of the metallic top layer or the metallic bottom layer configured for mounting thereon of a connector, opposite the first side, for coupling to a shielded communications cable.

2. The printed circuit board of claim 1, wherein the metallic side layer of the EMC/EMI shielding enclosure is formed of a copper plating electrically connecting the metallic top layer and the metallic bottom layer to form a metallic enclosure disposed in propinquity to, and enveloping, the printed circuit board.

3. The printed circuit board of claim 1, wherein the metallic side layer of the EMC/EMI shielding enclosure is formed by a plurality of stitching vias electrically connecting the metallic top layer and the metallic bottom layer.

4. The printed circuit board of claim 3, wherein the metallic side layer of the EMC/EMI shielding enclosure is formed by two or more rows of the plurality of stitching vias.

5. The printed circuit board of claim 1, wherein the substrate further comprises:
a first surface and a second surface;
a plurality of high-density interconnect vias penetrating the first surface and extending partially through the printed circuit board toward the second surface, the high-density interconnect vias configured to interconnect at least one component to the printed circuit board; and a plurality of electrical connectors disposed in a region of the second surface opposite the high-density interconnect vias and configured to interface with one or more signal processing components disposed on the second surface.

6. The printed circuit board of claim 5, wherein the plurality of high-density interconnect vias comprise one of: blind vias, buried vias, and micro-vias.

7. The printed circuit board of claim 1, wherein the EMC/EMI shielding enclosure further comprises a third opening between the first opening and the second opening, configured for mounting thereon of a surface mounted capacitor configured to couple a digital grounding layer and a cable grounding layer.

8. The printed circuit board of claim 1, wherein the substrate further comprises:
an embedded capacitor, formed on an internal layer of the printed circuit board, configured to couple a digital ground layer and a cable grounding layer, wherein the metallic top layer is deposited above the embedded capacitor.

9. The printed circuit board of claim 1, wherein the metallic top layer and the metallic bottom layer form a continuous enclosure over the uppermost layer of the substrate and the bottommost layer of the substrate respectively.

10. A method of manufacturing a printed circuit board comprising an integrated electromagnetic compatibility/electromagnetic interference (EMC/EMI) shielding enclosure, the method comprising:
depositing a metallic top layer on top of a substrate so as to envelope an uppermost layer of the substrate;
depositing a metallic bottom layer on bottom of the substrate so as to envelop a bottommost layer of the substrate;
forming a metallic side layer along a length of one or more edges of the substrate to electrically connect the metallic top layer and the metallic bottom layer;
forming a first opening on a first side of one of the metallic top layer or the metallic bottom layer configured for mounting thereon of functional circuit elements; and
forming a second opening on a second side of one of the metallic top layer or the metallic bottom layer configured for mounting thereon of a connector, opposite the first side, for coupling to a shielded communications cable.

11. The method of claim 10, wherein depositing the metallic side layer comprises:
electroplating copper material on an edge of the substrate electrically connecting the metallic top layer and the metallic bottom layer.

12. The method of claim 10, wherein depositing the metallic side layer comprises:
stitching a plurality of vias along an edge of the substrate electrically connecting the metallic top layer and the metallic bottom layer.

13. The method of claim 12, wherein the metallic side layer of the EMC/EMI shielding enclosure is formed by stitching two or more rows of the plurality of vias.

14. The method of claim 10, further comprising:
forming a plurality of penetrating holes through a first surface and a second surface of the substrate; and
inserting a plurality of high-density interconnect vias penetrating the first surface and extending partially through the printed circuit board toward the second surface, wherein the high-density interconnect vias are configured to interconnect at least one component to the printed circuit board.

15. The method of claim 14, wherein inserting the plurality of high-density interconnect vias comprises:
inserting of blind vias, buried vias, and micro-vias penetrating the first surface and extending partially through the printed circuit board toward the second surface.

16. The method of claim 10, further comprising:
forming a third opening between the first opening and the second opening; and
mounting a surface-mounted capacitor configured to couple a digital ground and a cable ground at the third opening.

17. The method of claim 10, further comprising:
forming an embedded capacitor on an internal layer of the printed circuit board, wherein the embedded capacitor is configured to couple a digital ground layer and a cable grounding layer; and
depositing the metallic top layer above the embedded capacitor.

18. The method of claim 10, wherein depositing the metallic top layer and the metallic bottom layer further comprises:
depositing the metallic top layer and the metallic bottom layer to form a continuous enclosure over the uppermost layer of the substrate and the bottommost layer of the substrate respectively.

* * * * *